US012685179B2

(12) United States Patent
Low et al.

(10) Patent No.: US 12,685,179 B2
(45) Date of Patent: Jul. 14, 2026

(54) SEMICONDUCTOR PACKAGE AND METHOD FOR MARKING A SEMICONDUCTOR PACKAGE

(71) Applicant: Infineon Technologies Austria AG, Villach (AT)

(72) Inventors: Hwee Yin Low, Bukit Beruang (MY); Badrus Hisham Abdul Rani, Muar Johor (MY); Wee Aun Jason Lim, Melaka (MY); Ai Yun Loh, Melaka Tengah (MY); Muhamad Hairul Fauzi Wahid, Melaka Tengah (MY)

(73) Assignee: Infineon Technologies Austria AG, Villach (AT)

( * ) Notice: Subject to any disclaimer, the term of this patent is extended or adjusted under 35 U.S.C. 154(b) by 538 days.

(21) Appl. No.: 18/137,014

(22) Filed: Apr. 20, 2023

(65) Prior Publication Data

US 2023/0352422 A1 Nov. 2, 2023

(30) Foreign Application Priority Data

Apr. 29, 2022 (EP) ..................................... 22170987

(51) Int. Cl.
*H01L 21/78* (2006.01)
*B23K 26/0622* (2014.01)
(Continued)

(52) U.S. Cl.
CPC ......... *H10W 46/00* (2026.01); *B23K 26/0622* (2015.10); *B23K 26/364* (2015.10);
(Continued)

(58) Field of Classification Search
CPC . H01L 23/544; H01L 21/565; H01L 23/3121; H01L 23/3675; H01L 23/49562; H01L 23/49861; H01L 24/40; H01L 23/49513; H01L 23/49524; H01L 24/32; H01L 24/73; H01L 2223/54406; H01L 2223/54433; H01L 2224/32245; H01L 2224/4005; H01L 2224/40245;
(Continued)

(56) References Cited

U.S. PATENT DOCUMENTS 6,420,790 B1 * 7/2002 Koizumi ............. H01L 23/3121
257/E23.125
6,489,007 B2 * 12/2002 Grigg .................... B29C 64/135
283/37
(Continued)

FOREIGN PATENT DOCUMENTS

EP 1478022 A1 11/2004

*Primary Examiner* — Vu A Vu
(74) *Attorney, Agent, or Firm* — Murphy, Bilak & Homiller, PLLC

(57) ABSTRACT

In an embodiment, a semiconductor package is provided that includes a first package surface and a second package surface opposing the first surface, a plastic molding and one or more semiconductor dies. The first package surface includes a first surface of the plastic molding and a first metallic area exposed from the plastic molding. The first metallic area includes a first product marking including at least one alphanumeric character and the first surface of the plastic molding includes a second product marking including at least one alphanumeric character.

16 Claims, 6 Drawing Sheets

(51) Int. Cl.

| | |
|---|---|
| *B23K 26/364* | (2014.01) |
| *H10W 40/22* | (2026.01) |
| *H10W 46/00* | (2026.01) |
| *H10W 70/40* | (2026.01) |
| *H10W 74/01* | (2026.01) |
| *H10W 74/10* | (2026.01) |
| *B23K 101/40* | (2006.01) |
| *B23K 103/00* | (2006.01) |
| *B23K 103/12* | (2006.01) |
| *H10W 72/00* | (2026.01) |
| *H10W 72/60* | (2026.01) |
| *H10W 90/00* | (2026.01) |

(52) U.S. Cl.

CPC ......... *H10W 40/22* (2026.01); *H10W 70/479* (2026.01); *H10W 70/481* (2026.01); *H10W 74/016* (2026.01); *H10W 74/114* (2026.01); *B23K 2101/40* (2018.08); *B23K 2103/12* (2018.08); *B23K 2103/42* (2018.08); *H10W 46/103* (2026.01); *H10W 46/401* (2026.01); *H10W 70/417* (2026.01); *H10W 70/466* (2026.01); *H10W 72/07653* (2026.01); *H10W 72/631* (2026.01); *H10W 72/886* (2026.01); *H10W 90/736* (2026.01); *H10W 90/766* (2026.01)

(58) Field of Classification Search

CPC . H01L 2224/73263; H01L 2924/13091; H01L 23/49575; H01L 24/29; H01L 24/37; H01L 24/83; H01L 24/92; H01L 2224/29101; H01L 2224/37013; H01L 2224/83801; H01L 2224/84801; H01L 2224/92246; H01L 2924/181; H01L 21/56; H01L 23/36; H01L 23/3107; H01L 24/84; H01L 2223/54486; H01L 21/6836; H01L 21/67282; H01L 21/67242; H01L 23/367; H01L 23/49541; H01L 2223/54413; B23K 26/0622; B23K 26/364; B23K 2101/40; B23K 2103/12; B23K 2103/42; B23K 26/362

USPC .......................................... 257/767

See application file for complete search history.

(56) References Cited

U.S. PATENT DOCUMENTS

| | | | | |
|---|---|---|---|---|
| 6,939,501 B2* | 9/2005 | Grigg | ..................... | B33Y 30/00 |
| | | | | 257/E23.179 |
| 6,979,910 B2* | 12/2005 | Shirasaka | .............. | H05K 3/303 |
| | | | | 257/E23.179 |
| 7,154,168 B2* | 12/2006 | Joshi | ................... | H01L 23/3185 |
| | | | | 257/E23.125 |
| 7,564,123 B1 | 7/2009 | Wang et al. | | |
| 7,619,302 B2* | 11/2009 | Hauenstein | ......... | H01L 23/3121 |
| | | | | 257/666 |
| 7,622,806 B2* | 11/2009 | Su | .......................... | H01L 23/544 |
| | | | | 257/739 |
| 7,902,657 B2* | 3/2011 | Gomez | ................... | H01L 24/40 |
| | | | | 257/676 |
| 8,106,501 B2* | 1/2012 | Quinones | ............... | H01L 24/31 |
| | | | | 257/E23.101 |
| 8,138,058 B2* | 3/2012 | Tanaka | ................. | G03F 7/7085 |
| | | | | 257/E23.179 |
| 8,749,989 B1* | 6/2014 | Kaylie | ............. | H01L 23/49805 |
| | | | | 361/768 |
| 8,835,229 B2* | 9/2014 | Banach | ................. | H01L 23/544 |
| | | | | 438/127 |
| 9,105,619 B2* | 8/2015 | Briere | ................. | H01L 23/4334 |
| 9,318,424 B2* | 4/2016 | Niu | ....................... | H01L 23/544 |
| 9,508,696 B2* | 11/2016 | Chen | .................... | H01L 23/544 |
| 9,613,912 B2* | 4/2017 | Scanlan | ................. | H01L 21/78 |
| 9,620,440 B1* | 4/2017 | Shibuya | ................. | H01L 25/50 |
| 9,972,576 B2* | 5/2018 | Otremba | .............. | H01L 23/535 |
| 10,096,553 B2* | 10/2018 | Su | .......................... | H01L 23/544 |
| 10,615,103 B2* | 4/2020 | Inoue | ............... | H01L 23/49548 |
| 11,355,356 B1* | 6/2022 | Tung | .................... | H01L 21/561 |
| 2007/0202680 A1* | 8/2007 | Ismail | .................. | H01L 21/561 |
| | | | | 257/E23.092 |
| 2008/0023807 A1 | 1/2008 | Noquil et al. | | |
| 2009/0057852 A1 | 3/2009 | Madrid | | |
| 2011/0304032 A1* | 12/2011 | Ramos | ................. | H01L 21/568 |
| | | | | 438/119 |
| 2012/0290117 A1* | 11/2012 | Wang | .................... | H01L 23/544 |
| | | | | 700/286 |
| 2015/0063760 A1* | 3/2015 | Pommer | .............. | G02B 6/4246 |
| | | | | 385/79 |
| 2019/0378785 A1 | 12/2019 | Muto et al. | | |
| 2020/0135656 A1 | 4/2020 | Zhou et al. | | |
| 2020/0203243 A1* | 6/2020 | Koduri | ............. | H01L 23/49575 |
| 2022/0122906 A1 | 4/2022 | Yuferev et al. | | |

* cited by examiner

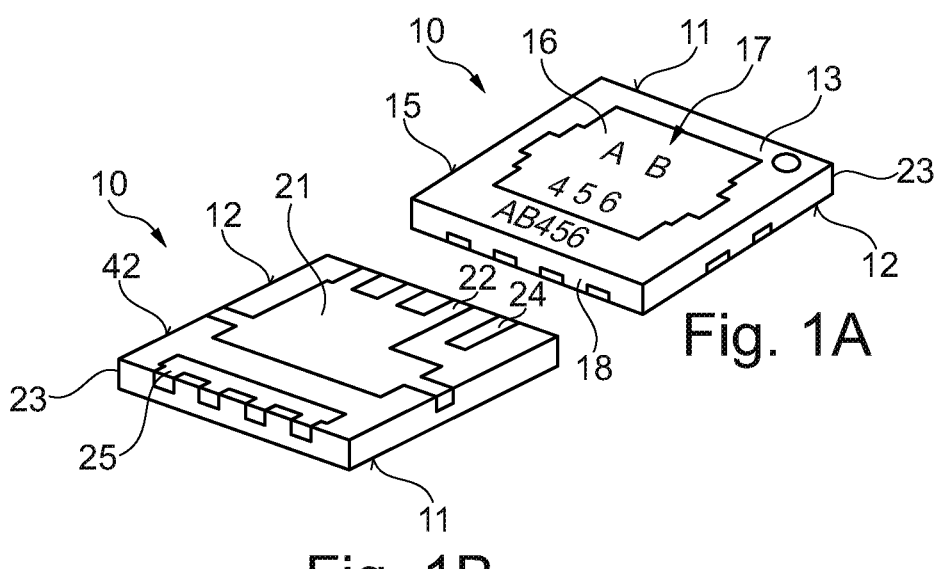
Fig. 1A
Fig. 1B
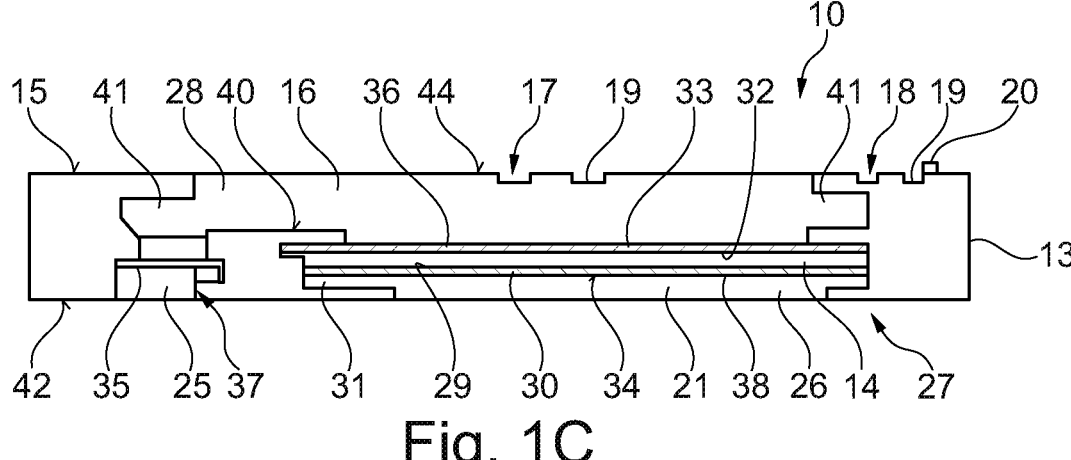
Fig. 1C
Fig. 1D

SEMICONDUCTOR PACKAGE AND METHOD FOR MARKING A SEMICONDUCTOR PACKAGE

BACKGROUND

A semiconductor package may include one or more semiconductor devices in a housing. The package may include a substrate or a leadframe which includes outer contacts which are used to mount the electronic component on a redistribution board such as a printed circuit board. The package also includes internal electrical connections from the semiconductor device to the substrate or leadframe. The housing may be formed of a plastic molding which covers the semiconductor device and the internal electrical connections.

EP 1 478 022 A1 discloses a semiconductor package including product tracking information and product identity information, whereby the product tracking information is located on the top surface of the package body. Semiconductor packages are normally marked with product tracking information and product identity information prior to sale. Product tracking information may include the wafer fabrication lot number, the date on which the wafer was fabricated, the assembly lot number and the date on which the package was assembled. This information allows the manufacturer to track the manufacturing process and may be used to assist in solving manufacturing problems. Product identity information may include designations for the product type, package type and performance, for example speed or voltage. Other types of information about the package or semiconductor device within the package can be included in this information or be derivable from the information marked on the outer surface of the package.

Since semiconductor packages have a limited area on which the information may be positioned, the information may be marked in the form of an alphanumeric code or barcode or data code matrix which is readable so as to convey more information about the package within a smaller space.

Further improvements are desirable for marking semiconductor packages and for providing semiconductor packages with a marking indicating information about the product.

SUMMARY

According to the invention, a semiconductor package is provided which comprises a first package surface and a second package surface opposing the first package surface, a plastic molding and one or more semiconductor dies. The first package surface comprises a first surface of the plastic molding and a first metallic area exposed from the plastic molding. The first metallic area comprises a first product marking and the first surface of the plastic molding comprises a second product marking.

The semiconductor package, therefore, includes two product markings which are arranged laterally adjacent one another on the first package surface and which are positioned on differing portions of the first package surface, namely on or in the first metallic area and on or in the plastic molding. The two product markings are also positioned on or in two different materials, namely the metal of the first metallic area and the plastic of the plastic molding.

The use of the two product markings on the same side of the package is useful in applications in which a heatsink is attached to the exposed first metallic area since the product marking arranged on the first metallic area is covered by the heatsink. Even if the heatsink is removed, remaining portions of the adhesive material, for example solder or polymer adhesive, which was used to attach the heatsink to the first metallic area, may obscure the first product marking and make it difficult or impossible to read. Since the second product marking is arranged on the plastic molding and is not in contact with the heatsink or adhesive that was used to attach the heatsink to the first metallic area, the information about product can be inferred from the second product marking.

The plastic molding may comprise a thermosetting resin which includes a filler material which may be ceramic particles or fibres. An example of a molding material is an epoxy resin with a filler material.

The first metallic area may be formed of a metal, for example copper, or an alloy, for example a copper alloy, or may comprise a multilayer structure. For example, the outermost surface may comprise a finishing layer, such as silver or nickel and the body of the metallic part providing the first metallic area may be formed of copper.

in some embodiments, the first product marking comprises at least one alphanumeric character and the second product marking comprises at least one alphanumeric character. An alphanumeric character describes one of the numbers 0 to 9 and the letters of the Latin alphabet. Punctuation marks such as full stops, commas, colons, back slashes, forward slashes etc are excluded from this definition.

In some embodiments, one or both of the first and second product marking may be a two-dimensional matrix.

In some embodiments, the first product marking and the second product marking each comprise two or more alphanumeric characters. In some embodiments, the first product marking and the second product marking include the same alphanumeric character or characters. The first and second product marking, therefore, provide alternative markings which provide the same information about the product and alone each provide the predetermined information about the product.

In some embodiments, the second product marking comprises a plurality of alphanumeric characters which are arranged in a vertical row.

In some embodiments, the alphanumeric characters have a height which is greater than a width. This may be used to assist in automatically reading the alphanumeric character since the orientation of the character can be more easily automatically determined.

In some embodiments, the first product marking is formed by indentations and/or protrusions in a surface of the first metallic area. For example, the first product marking may be formed by indentations or grooves formed in the exposed outer surface of the metallic area such that the regions of the first metallic area between the indentations or grooves form protrusions that have the average height of the first surface of the first metallic area. Alternatively, or in addition, the first product marking may be formed by indentations or grooves formed in the exposed outer surface of the metallic area such that the edges of the indentation or grooves include protrusions which protrude above the average height of the first surface of the first metallic area.

Similarly, the second product marking formed in the plastic molding may be formed of indentations and/or protrusions in the first surface of the plastic molding. For example, the mark may be formed by forming indentations or grooves in the first surface of plastic molding which are spaced apart by raised areas.

In some embodiments, the first and/or second product marking is formed by laser marking. For example, indentations may be formed in the first metallic area and plastic molding by evaporation of material using laser marking.

In some embodiments, the first and/or second product marking is formed by ink, for example by printing one or more alphanumeric characters, an alphanumeric code or two-dimensional matrix on the first metallic area and/or first surface of the plastic molding in ink. In these embodiments, the first and/or second product marking is formed by protrusions.

In some embodiments, the second package surface comprises a second surface of the plastic molding and a second metallic area exposed from the plastic molding. The second surface of the plastic molding opposes the first surface of the plastic molding. The first and second metallic areas, therefore, face in opposing directions and may be used to provide the semiconductor package with double sided cooling.

In some embodiments, the first package surface is the top surface of the semiconductor package and the second package surface is the bottom surface of the semiconductor package. The bottom surface of the semiconductor package can be distinguished from the top surface in that it further comprises at least one contact area that is exposed from the plastic molding. The at least one contact area is electrically connected to the semiconductor die.

In some embodiments, the first metallic area is provided by a contact clip and the second metallic area is provided by a die pad. The contact clip is mounted on the semiconductor die and the semiconductor die is mounted on the die pad. The semiconductor die can be sandwiched between the lower surface of the contact clip and the upper surface of the die pad, with the upper surface of the contact clip providing the first metallic area and the lower surface of the die pad providing the second metallic area.

The contact clip may be electrically connected to the semiconductor die, for example electrically connected to a contact pad positioned on the top surface of the semiconductor die, e.g. by a solder connection. The semiconductor die may also be electrically connected to the die pad by a solder connection.

In some embodiments, the semiconductor die is a vertical transistor device with a source pad and the gate pad on a first die side and a drain pad on the second die side opposing the first die side. The vertical transistor device may be a MOSFET (Metal Oxide Semiconductor Field Effect Transistor) device, a superjunction device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) de-vice and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

The vertical transistor device may be orientated in the package such that the source pad is mounted on and electrically connected to the die pad and the contact clip is connected to the drain pad, or such that the drain pad is mounted on and electrically connected to the die pad and the contact clip is connected to the source pad.

The semiconductor die may be mounted within the semiconductor package in various orientations. In an embodiment, the semiconductor die is a vertical transistor device and the source pad is mounted on the die pad and the gate pad is mounted on a lead which is arranged laterally adjacent and spaced apart from the die pad. The clip is mounted on the drain pad and extends between the drain pad and a drain lead, which is arranged laterally adjacent to and spaced apart from the die pad. This arrangement may be referred to as a source down arrangement. In some embodiments, the clip and the drain lead may be integral.

In an embodiment, the semiconductor die is a vertical transistor device and the drain pad is mounted on the die pad so that the gate pad and source pad face upwardly. In this embodiment, the gate pad is electrically connected to a gate lead, which is arranged laterally adjacent and spaced apart from the die pad, by a connector, for example bond wire. The clip is mounted on and extends between the source pad and source lead which is arranged adjacent and spaced apart from the die pad. In some embodiments, the source lead is integral with the clip.

In some embodiments, the package includes two or more semiconductor dies, each providing a semiconductor device. For example, the package may include two transistor devices, a transistor device and a diode, or two transistor devices and a gate driver. The two transistor devices may be electrically connected to form a half-bridge.

In some embodiments, the semiconductor package comprises a redistribution structure, which may be a leadframe. The die pad is part of the leadframe and the leadframe further comprises at least one lead which is arranged laterally adjacent and spaced apart from the die pad. One or more leads may be integral with and extend from the die pad. In these embodiments, the leadframe and, therefore, the die pad and the at least one lead, are formed of metal, such as copper. The at least one lead includes provides a contact area which is exposed from the plastic molding. In some embodiments, for example in leadless packages and surface mountable devices (SMDs), the lower surface of the lead provides the contact area. In embodiments with through leads, also known as pins, all of the surfaces of the lead or pin may provide a contact area.

In other embodiments, the semiconductor package includes a redistribution substrate which may comprise an electrically insulating core layer and a conductive redistribution structure. In these embodiments, the second metallic area exposed in the bottom surface of the plastic molding of the semiconductor package may be formed by a conductive layer arranged on the lower surface of the redistribution substrate and the semiconductor die may be mounted on a die pad arranged on the opposing upper surface of the redistribution substrate. These two conductive surfaces may be thermally connected to one another by vias extending through the thickness of the core of the redistribution substrate. In some embodiments, these two conductive areas are electrically connected to one another by electric conductive vias which extend through the thickness of the core of the redistribution substrate.

The first metallic area is exposed from the plastic molding and therefore provides additional cooling to dissipate heat generated by the semiconductor die within the package into the environment. In some embodiments, the semiconductor package further includes a heat sink which is mounted on the first metallic area. The heatsink may be mounted on the first metallic area using solder or electrically conductive adhesive or may be mounted on the first metallic area by way of an electrically insulating adhesive layer such that the heatsink is electrically insulated from the first metallic area and has different potential to the clip. The heatsink may have the form of a metallic plate or a metallic plate with fins.

In some embodiments, the semiconductor package includes only the first metallic area exposed from the plastic molding and may be used to provide topside cooling. In other embodiments, in which the semiconductor package includes the second metallic area exposed from the plastic molding on the opposing side of the semiconductor package, double sided cooling is provided. For example, if the second metallic area is provided by the exposed lower surface of the die pad, the die pad may be mounted on a further heatsink arranged on or in a higher level circuit board on which the package is to be mounted and a heat sink is attached to the first metallic area.

According to the invention, a method for marking the second semiconductor package is also provided. The method comprises providing a semiconductor package comprising a first package surface and a second package surface opposing the first package surface, a plastic molding and one or more semiconductor dies. The first package surface comprises a first surface of the plastic molding and a first metallic area that is exposed from the plastic molding. A first product marking is formed in the first metallic area and a second product marking is formed in the first surface of the plastic molding.

According to this method for marking a semiconductor package, the two product markings are formed on the same surface, namely the first package surface of the semiconductor package and are formed in differing materials, namely the first metallic area and the plastic molding.

In some embodiments, the first product marking comprises at least one alphanumeric character that is formed in the first metallic area and the second product marking comprising at least one alphanumeric character that is formed in the first surface of the plastic molding. In some embodiments, one or both of the first and second product marking comprises a two-dimension matrix.

In some embodiments, each of the first product marking and the second product marking comprises two or more alphanumeric characters. In some embodiments, the first and second product marking include the same one or more alphanumeric characters or alphanumeric code.

In some embodiments, the first product marking and/or the second product marking are formed using a laser marking process. The laser marking process may comprise directing a laser beam over the surface of the first metallic area and the first surface of the plastic molding and forming indentations and/or protrusions in the first surface of the first metallic area in the first surface of the plastic molding, respectively, that have the shape of the marking, for example at least one alphanumeric character.

The laser may comprise a green laser, Nd:YAG laser or an infrared laser. The type of laser and the power and/or pulse length of the laser may be selected depending on the material of the first metallic area and the plastic molding and may be different for forming the first product marking and the second product marking.

In some embodiments, the first product marking and/or the second product marking are formed by ink, for example by printing.

In some embodiments, the first and second product marking are formed by different processes, for example the first product marking is formed by printing ink and the second product marking is formed by laser marking. This may be done to increase the contrast and automatic recognition of each of the two product markings. In order to increase the speed at which product marking takes place, the same type of marking process, for example laser marking, may be used for both the first and second product marking.

In some embodiments, the semiconductor package is provided in a form in which the plastic molding completely covers the first metallic area such that initially, the first package surface is formed only of plastic molding material. In these embodiments, the method may further comprise exposing the first metallic area from the plastic molding by grinding an outer initial surface of the plastic molding that completely covers the first metallic area. This grinding process removes portions of the plastic molding, reduces the thickness of the plastic molding and exposes the first metallic area.

In this embodiment, the plastic molding includes a ground surface which has a higher surface roughness than the surface of the surfaces of plastic molding which are not ground, for example, the surface roughness of the outer surface of the plastic molding forming the second package surface or forming the side faces of the package.

The use of the two product markings, one on the plastic molding and one on the first metallic area, may be used to mitigate any difficulties with recognising the second product marking formed in the rougher ground surface of the plastic molding, for example, using automatic recognition machines. The use of the two product markings is also useful in embodiments in which a heatsink is attached to the exposed first metallic area since the product marking arranged on the first metallic area is covered by the heatsink. Even if the heatsink is removed, remaining portions of the adhesive material, for example solder or adhesive may obscure the first product marking and make it difficult or impossible to read. Since the second product marking is arranged on the plastic molding and is not in contact with the heatsink or adhesive, the information about product can be inferred from the second product marking.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIGS. 1A to 1E illustrate views of a semiconductor package, whereby FIG. 1A illustrates a perspective top view, FIG. 1B a perspective bottom view and FIG. 1C cross-sectional view. FIG. 1D illustrates a perspective bottom view of a semiconductor package according to an alternative embodiment and FIG. 1E illustrates a perspective top view of a semiconductor package according to a further alternative embodiment.

DETAILED DESCRIPTION

Figure 1E:
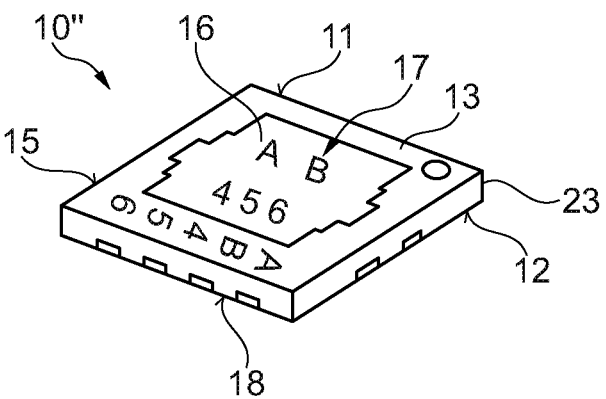

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1A to 1D illustrate views of a semiconductor package 10 that includes product markings. FIG. 1A illustrates a top perspective view, FIG. 1B a bottom perspective view and FIG. 1C a cross-sectional view of the semiconductor package 10.

The semiconductor package 10 comprises a first package surface 11 and a second package surface 12 which opposes the first package surface. The first package surface 11 is the top surface and the second package surface 12 is the bottom surface. The semiconductor package 10 further comprises a plastic molding 13 and a semiconductor die 14 which can be seen in the cross-sectional view of FIG. 1C. The first package surface 11 comprises a first surface 15 of the plastic molding 13 and a first metallic area 16 which is exposed from the plastic molding 13. The first metallic area 16 comprises a first product marking 17 which in this embodiment comprises an alphanumeric code comprising a plurality of alphanumeric characters. The first surface 15 of the plastic molding 13 comprises a second product marking 18 which also comprises an alphanumeric code comprising a plurality of alphanumeric characters. In other embodiments, the first and/or second product marking 17, 18 may include a single alphanumeric character or a two-dimensional matrix, for example.

The first package surface 11, therefore, includes two product markings 17, 18 which are arranged laterally adjacent one another and which are positioned on different portions and different materials of the semiconductor package 10, namely the first metallic area 16 and the plastic molding 13. As can be seen in the cross-sectional view of FIG. 1C, the first product marking 17 is formed by at least one indentation 19 which is formed in the outer surface 44 of the first metallic area 16 that is exposed from the plastic molding 13. The second product marking 18 is also formed by indentations 19 which are formed in the first surface 15 of the plastic molding. In some embodiments, the first product marking 17 and/or the second product marking 18 may include a protrusion 20 in addition to, or in place of, the indentations 19. The indentations 18 and/or protrusions 30 have a shape which corresponds to the alphanumeric character or characters.

In some embodiments, such as that illustrated in FIGS. 1A to 1E, the first and second product markings 17, 18 include the same alphanumeric character or the same plurality of alphanumeric characters forming an alphanumeric code from which information about the package, i.e product information, is derivable. The alphanumeric characters of the first and second markings 17, 18 may indicate a plant code identifying the plant where the semiconductor device was made, a date code indicating when the semiconductor device was made, a lot or sublot number assigned to each device assembly lot or sublot, and a device ID code identifying the type of semiconductor package.

The alphanumeric characters of the first product marking may be arranged on the first metallic area 16 in one or more rows or columns and the alphanumeric characters of the second product marking 18 may be arranged on the plastic molding 13 in one or more rows or columns. In some embodiments, the second product marking 18 arranged on the plastic molding 13 has a plurality of alphanumeric characters which are arranged in a vertical row. The arrangement and position of the alphanumeric character or characters of the first and second markings 17, 18 may depend on the available space on the first surface first package surface 11. In some embodiments, such as that illustrated in FIG. 1A, the first metallic area 16 has an area such that it occupies at least half of the area of the first package surface 11. The plastic molding 13 may form a border around the first metallic area 16 which is arranged at or towards the centre of the first package surface 11. The first product marking 17 may be arranged in two rows on the first metallic area 16 and the second product marking 18 may be arranged in the first surface 15 of the plastic molding 13 a single horizontal row or a single vertical row or be split and arranged adjacent two side faces 23 of the semiconductor package 10.

As can be seen from the bottom view of the semiconductor package 10 in FIG. 1B, the second package surface 12 comprises a second metallic area 21 which is exposed from the plastic molding 13. In some embodiments, the second metallic area 21 has integral leads 22 which extend from the second metallic area 21 to the side faces 23 of the package 10. The second package surface 12 also comprises a first lead 24 and a second lead 25 which are arranged at the edge of the second package surface 12 and which are spaced apart from the second metallic area 21. The lower surfaces 36 of the leads 22, 24, 25 and the second metallic area 21 each provide a contact area of the semiconductor package 10.

As can be seen from the cross-sectional view of FIG. 10, the semiconductor die 14 is mounted on a die pad 26 which forms part of a lead frame 27 of the semiconductor package 10. The lower surface of the die pad 26 is exposed from the plastic molding 13 in the second package surface 12 and forms the second metallic area 21. The lead frame 27 also includes the leads 22, 24, 25, of which the second lead 25 can be seen in the cross-sectional view of FIG. 10. The package 10 further includes a contact clip 28 which is mounted on the opposing surface of the semiconductor die 14 from the die pad 26 and which extends from the semiconductor die 14 to the second lead 25 and which electrically connects the semiconductor die 14 to the second lead 25. A portion of the upper surface of the clip 28 is exposed from the plastic molding 13 in the upper first package surface 11 and forms the first metallic area 16.

In some embodiments, the semiconductor die 14 is a vertical transistor device, such as a vertical power MOSFET. The semiconductor die 14 has a first die surface 29 which comprises a source pad 30 and gate pad 31 and a second die surface 32 which opposes the first die surface 29 and which comprises a drain pad 33. In some embodiments, such as that illustrated in FIG. 10, the semiconductor die 14 is arranged with a source down arrangement such that the source pad 30 is mounted on and electrically coupled to the upper surface 34 of the die pad 26 and the gate pad 31 is mounted on and electrically coupled to an upper surface 35 of the first lead 24, for example the upper surface 35 of the lead 24 which can be seen in the bottom view of FIG. 1B. The drain pad 33 of the semiconductor die 14 faces upwardly and is electrically connected to the drain lead 25 by the contact clip 28. The contact clip 28 is arranged on and electrically connected to the drain pad 33 by a solder connection 36 and to the upper surface 35 of the second lead 25 by a solder connection 37. The source pad 30 is mounted on and electrically connected to the upper surface 34 of the die pad 26 by a solder connection 38.

The plastic molding 13 covers the semiconductor die 14, the upper surface 34 and side faces 39 of the die pad 26 and of the leads 22, 24, 25, the lower surface 40 of the contact clip 28 and the entire surfaces of the distal ends 41 of the contact clip 28.

FIG. 1D illustrates a bottom view of a semiconductor package 10' according to an alternative embodiment. The semiconductor package 10' includes first and second product markings 17, 18, each comprising at least one alphanumeric character positioned in the first metallic area 16 and in first surface 15 of the plastic molding 13 as in the semiconductor package 10 which cannot be seen in the bottom view of FIG. 1D. The semiconductor package 10' differs from the semiconductor package 10 in the arrangement of the leads 22, 24, 25 and second metallic area 21 in the second package surface 12 and in the arrangement of the first lead 24 that is connected to the gate pad 31 with respect to the second metallic area 21 provided by the lower surface of the die pad 26. In the embodiment illustrated in FIG. 1D, the gate lead 24 is arranged in the second surface 12 orthogonal to the second leads 25 that are connected to the drain pad 33 rather than on the opposing side of the bottom surface 12 to the second lead 25 as in the embodiment illustrated in FIG. 1B.

FIG. 1E illustrates a perspective top view of a semiconductor package 10" according to a further alternative embodiment. The semiconductor package 10" includes first and second product markings 17, 18, each comprising at least one alphanumeric character positioned in the first metallic area 16 and in first surface 15 of the plastic molding 13 as in the semiconductor package 10. The semiconductor package 10" differs from the semiconductor package 10 in the arrangement of the alphanumeric characters of the second product marking 18. In this embodiment, the alphanumeric characters of the second product marking 18 are arranged vertically, i.e. in a vertical row, as opposed to horizontally as in the embodiment shown in FIG. 1A.

In some embodiments, the first product marking 17 may be arranged on the second metallic area 21 in the bottom surface of the 12 of the semiconductor package 10, 10', 10" and the second product marking 18 may be formed in the second surface of the plastic molding 13 which forms the second package surface 12. In some embodiments, the package 10, 10', 10" may further comprise one or more product markings on the second package surface 12. In addition to the first and second product markings 17, 18 on the first surface 11, one or more further product markings, for example comprising one or more alphanumeric characters, may be arranged on or in the second metallic area 21 and/or on or in the second surface 42 of the plastic molding 13 of the second package surface 12.

Figure 2:
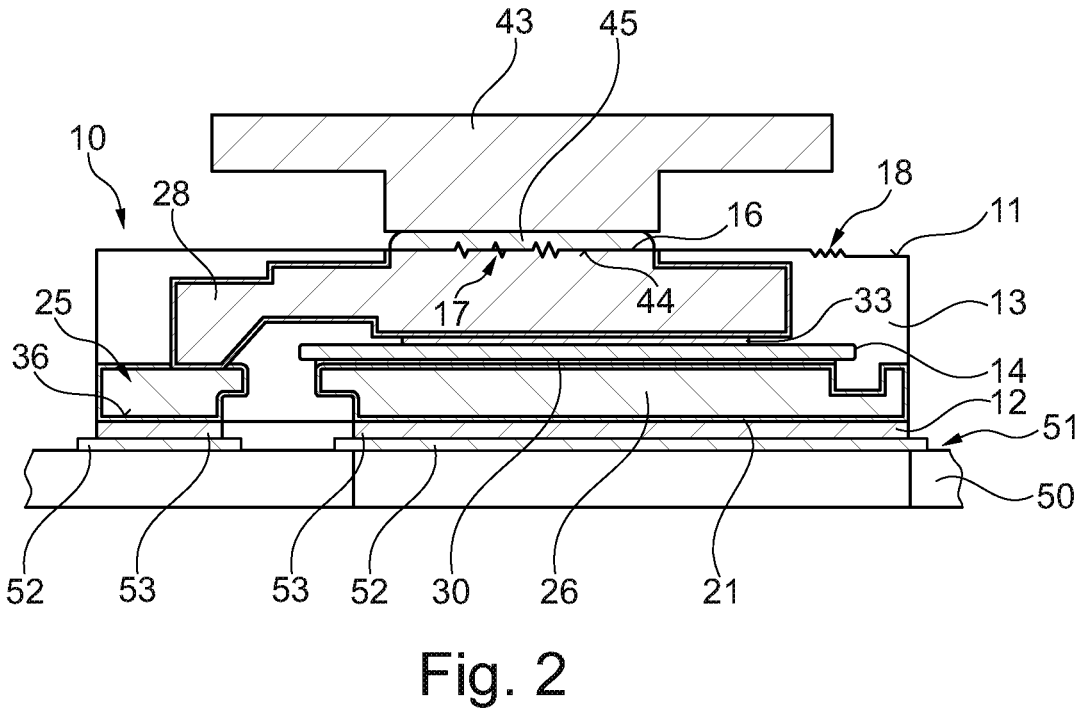
FIG. 2 illustrates a cross-sectional view of the semiconductor package of FIGS. 1A to 1E with a heatsink.

FIG. 2 illustrates a cross-sectional view of the semiconductor package 10 including a heatsink 43 mounted on the free lying surface 44 of the contact clip 28 which forms the first metallic area 16 in the first package surface 11.

FIG. 2 also illustrates the semiconductor package 10 in the mounted condition in which the semiconductor package 10 is mounted on a higher level circuit board 50 which comprises a conductive redistribution structure 51 and contact areas 52 onto which the contact areas of the package 10, for example the lower surfaces 36 of the leads 22, 24, 26 and the lower surface 21 of the die pad 26 are mounted and electrically connected, for example, by means of solder connections 53.

The heatsink 43 is mounted on the first metallic area 16 by tin-based soft solder 45 in this embodiment. The first product marking 17 is, therefore, covered by the solder 45 and the heatsink 43 and cannot be accessed to ascertain information from the product marking 17. The second product marking 18 positioned in the first surface of the plastic molding 13 is, however, uncovered and can be more easily accessed to read the second product marking 18 and recover the information about the product, e.g. the semiconductor die and/or package, that is derivable from the second product marking 18. Upon removal of the heatsink 43 from the first metallic area 16, some of the solder 45 may remain and partially or even completely obscure the first product marking 17.

The solder connection 53 as well as the solder connection 45 that connects the heatsink 43 to the contact clip 28 may be replaced by electrically conductive adhesive or diffusion solder. In other embodiments, the heat sink 43 may be attached to the upper surface 44 of the contact clip using electrically insulating adhesive so that the heat sink 43 is electrically insulated from the contact clip 28.

Figure 3:
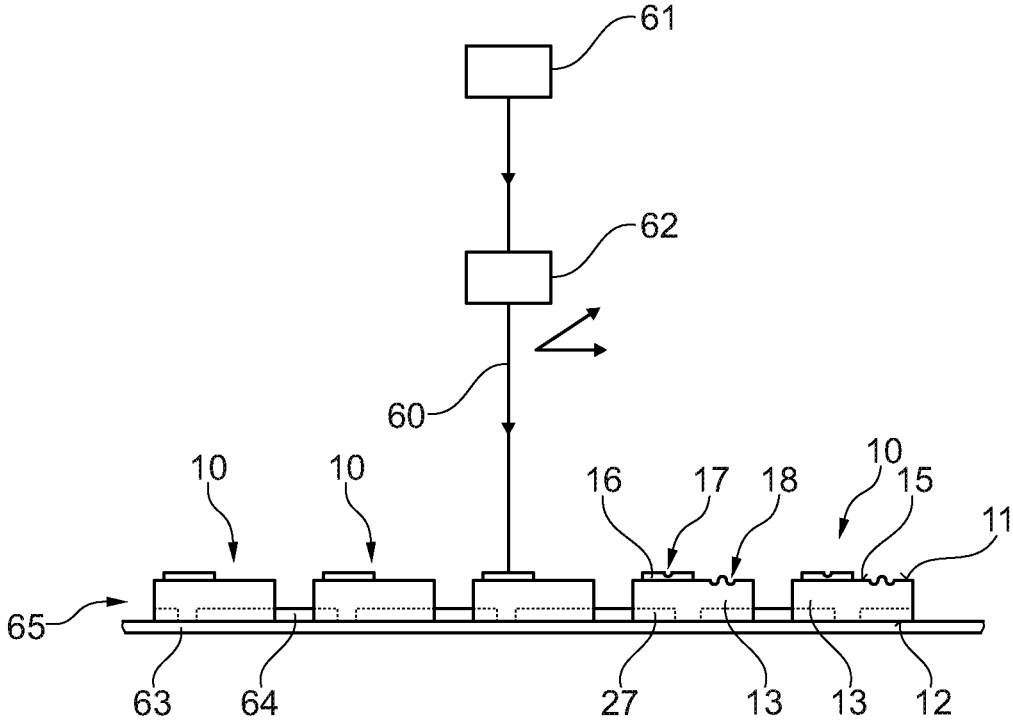
FIG. 3 illustrates a schematic view of a method for marking a semiconductor package.

FIG. 3 illustrates a schematic view of a method for marking a semiconductor package, such the semiconductor package 10 illustrated in FIGS. 1A-1E and 2. In this embodiment, the first and second markings 17, 18 may be formed in the first metallic area 16 and first surface of the plastic molding 13, respectively, using a laser marking process. A focussed laser beam 60 from a laser source 61 is directed using directing means 62 over the upper surface of the first metallic area 16 and such that the laser 60 evaporates and removes portions of the outer surface 44 of the first metallic area 16 and forms one or more indentations 19 in the outer surface 44 having a lateral form corresponding to the desired first product marking, for example one or more alphanumeric characters. The laser 60 is then directed towards the first surface 15 of the plastic molding 13 and directed over the surface, removing portions to provide one or more indentations 19 corresponding to the form of the second product marking 18, e.g. the one or more alphanumeric characters, in the first surface 15 of the plastic molding 13 of the semiconductor package 10. Two product markings 17, 18 are easily and quickly formed in the same surface of the semiconductor package that are arranged laterally adjacent one another and which may have the same form, e.g. the same alphanumeric code of two or more alphanumeric characters.

Typically, a plurality of packages 10 are formed, for example in the form of a strip or panel 65 in which the packages 10 are arranged in rows and columns. The strip 65 and packages 10 are supported on a support 63, e.g. UV tape. In embodiments in which the semiconductor packages 10 include a leadframe 27, the strip 65 may include ties 64 between the individual leadframes 27 for individual packages 10 and a support frame which hold the individual leadframes 27 in the panel 65 or strip. The ties 64 are removed, for example by sawing or cutting to separate the individual packages 10 from the strip 65. Typically, marking of the semiconductor packages 10 is carried out before singulation of the individual packages 10 from the panel 65.

The first and second product markings 17, 18 may be used to facilitate accurate identification and traceability, which in turn facilitates quality assurance process across the entire life cycle chain and the process. Typical markings include 2D-data matrix codes to alphanumeric characters and customized contents.

The laser source 61 may be a green laser, Nd:YAG (Neodymium yttrium aluminium garnet) laser or an infrared laser. The power and/or pulse length of the laser 60 may be selected to produce an indentation 19 of a predetermined depth in the first package surface 11 and may be selected depending on the material in which the indentation 19 is to be formed.

Laser marking creates a permanent mark; is quick to carry out and has short set-up or changeover time. Laser marking is a non-contact thermal process that alters the surface to be marked by using the heat generated by the laser beam 61. Mark contrast may be provided by laser marking in various ways, including surface annealing, which applies relatively low temperatures to metallic surfaces to produce sharp, contrasting lines with very shallow penetration making it non-disruptive to the surface. Alternatively, laser marking can produce surface melting, which is commonly used to induce a colour change on plastic surfaces by melting the marking areas; or material vaporization, which marks a surface by removing material from it through vaporization, for example to form the indentation(s) 19.

A system for laser marking may enable optimization of some parameters to produce the markings on the surface. For example, two parameters which can be adjusted to form a product marking with good contrast are the lamp current and the laser pulse rate. The lamp current determines the power or energy being used to stimulate a material into photoemission, i.e., increasing the lamp power increases the laser amplification. The pulse rate may be adjusted to set the time between laser pulses that strike the surface. A higher pulse rate shortens the time for the laser system to charge up and therefore lowers the peak energy of the laser beam, reducing its ability to vaporize some material from the surface. Thus, vaporization capability is increased by using high-energy laser beams at lower pulsing frequencies.

One common type of NIR laser used in marking is the Nd:YAG (neodymium yttrium aluminium garnet) laser. Another common type is a green laser or second harmonic generation laser that is based on a process where light from a longer wavelength laser enters a non-linear crystal and is converted to shorter wavelength (i.e., higher frequency) laser light. For example, in a green laser, YAG infrared laser radiation with a wavelength of 1,064 nm is converted to 532 nm laser light.

Epoxy-based molding compounds absorb very well in the near IR. The near IR laser transforms the usually black molding compound into a grey/white powder, yielding high contrast marks. The depth of the marking can be selected depending on the thickness of the plastic molding compound at the first surface 11. For example, the depth of the indentation may be 30 μm to 50 μm using a Nd:YAG laser. A marking depth of only 10 μm or less may be provided by using a green laser as there is a stronger absorption at this wavelength by the epoxy matrix.

Figure 4A:
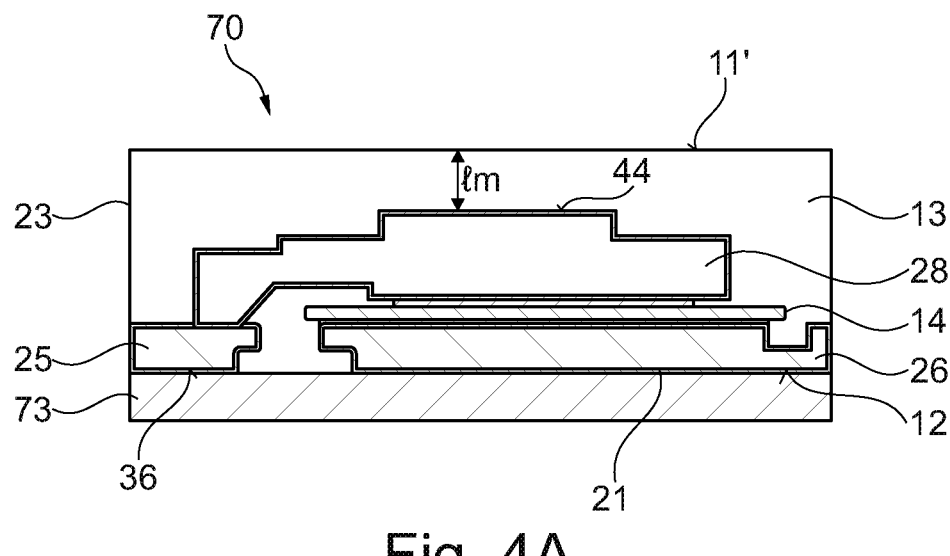
FIGS. 4A and 4B illustrate a method for preparing a surface of the semiconductor package prior to product marking.
Figure 4B:
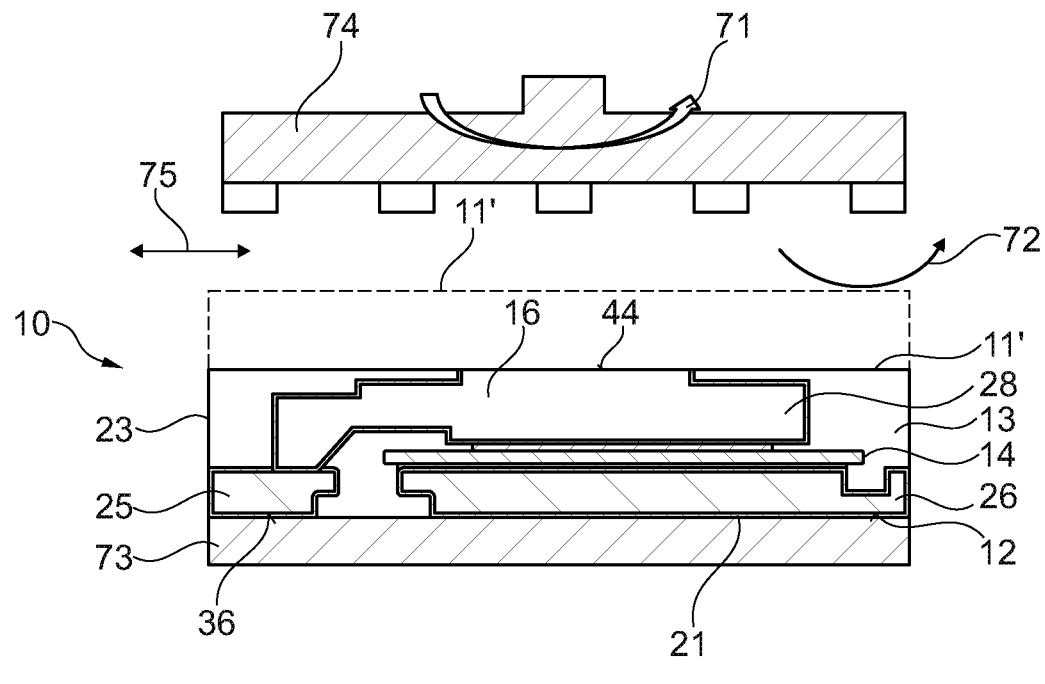

FIGS. 4A and 4B illustrate a method for preparing a surface of the semiconductor package prior to product marking. In some embodiments, an initial semiconductor package 70 is produced which differs from the semiconductor package 10 illustrated in FIGS. 1A to 1E in that the upper surface 44 of the contact clip 28 is covered by the plastic molding material 13. The first package surface 11' is formed entirely of the plastic molding compound. In some embodiments, the plastic molding 13 may have a thickness $t_m$ of around 280 μm above the upper surface of the contact clip 28. The contact areas 36 provided by the leads 22, 24, 25 as well as the lower surface 21 of the die pad 26 are exposed from the plastic molding 13 in the second package surface 12. In order to expose at least a portion of the contact clip 28 and provide a semiconductor package 10 with improved topside cooling as well the bottom side cooling which is provided by the exposed lower surface 21 of the die pad 26, a portion of the plastic molding 13 which covers the contact clip 28 may be removed, for example by grinding, as is illustrated in FIG. 4B, as indicated schematically by the arrows 71, 72.

The semiconductor packages 10' may be attached to a chuck 73 which rotates s shown by the arrow 72, The griding wheel 74 is attached to the spindle which also rotates in the same direction as the chuck 73, as shown by the arrow 71. The spindle is applied with some pressure to the upper surface 11' of the package 170 and moves laterally across the upper surface 11' of the package 70, as indicated schematically by the arrow 75, to grind the upper surface 11, removing material reducing the thickness of the package 10 and exposing a portion of the contact clip 28 to provide the first metallic area 16 in the first package surface 11. Typically, the panel or strip 75 with a plurally of packages 10 is subjected to the grinding process.

In some embodiments, around 350 μm of the thickness of the semiconductor package may be removed by the grinding process. The grinding process results in the first package surface 11 of the semiconductor package 10 including the plastic molding 13 having a surface roughness which is greater than the surface roughness of the plastic molding 13 which forms the side faces 23 and second package surface 12 of the semiconductor package 10. When the second product marking 18 is formed in the roughened surface 11 of the plastic molding, for example using laser marking, the contours of the second product marking 18 may be less distinguishable, not only to the naked eye, but also to automatic recognition systems due to the reduction in contrast between the indentation 19 and the first surface 15 of the plastic molding 13 caused by the rough surface 11 of the plastic molding 13. The first package surface 11 includes a further product marking, in the form of the first product marking 17 that is formed in the first metallic area 16 provided by the portion of the contact clip 28 which is now exposed from the plastic molding 13. This first product marking 17 may have better contrast than the second product marking 18 and can be used to assist in discerning the code of the first product marking 17 and, consequently, the information derivable for the first and second product marking 17, 18. A laser marking fabricated in a metallic surface is generally easier for automated systems to read, since the contrast between the indentation 19 and the surrounding surface of the metallic area 16, even for the ground surface of the first metallic area 16, has more contrast.

Figure 5A:
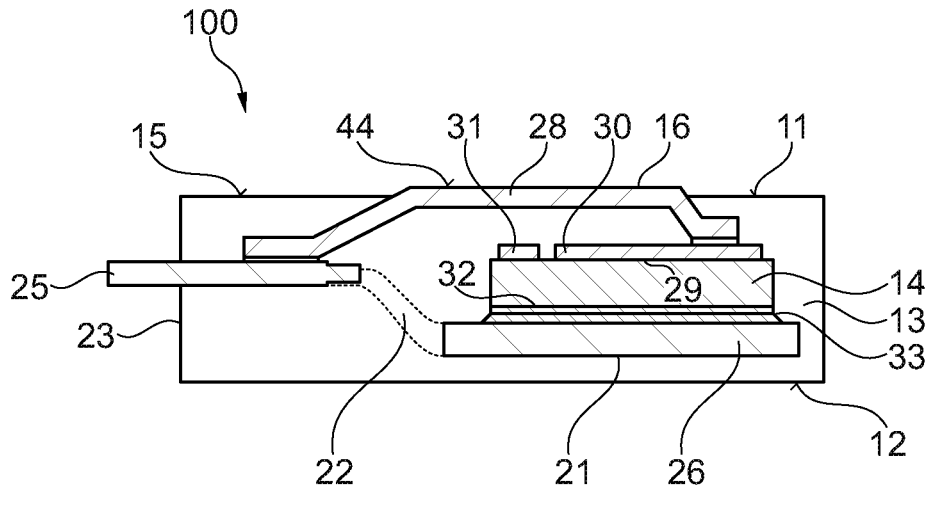
FIGS. 5A and 5B illustrate a semiconductor package according to another embodiment.
Figure 5B:
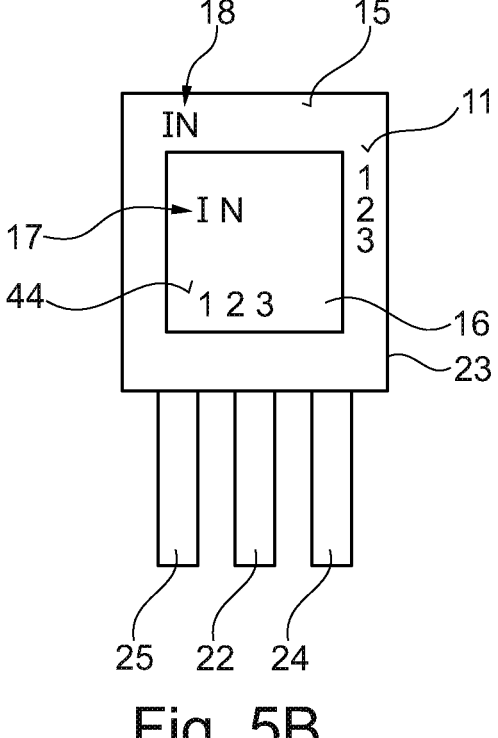

FIGS. 5A and 5B illustrate a semiconductor package 100 according to another embodiment. FIG. 5A illustrates a cross-sectional view and FIG. 5B a top view of the semiconductor package 100. In this embodiment, the semiconductor package 100 includes topside cooling, but no bottom side cooling.

In this embodiment, the lower surface 21 of the die pad 26 is entirely covered by the plastic molding compound 13 so that the second package surface 12 is formed entirely by the plastic molding compound. The uppermost surface 44 of the contact clip 26 is exposed from the plastic molding 13 in the first package surface 11. The package 100 may be a leaded or leadless package.

The semiconductor package 100 comprises a first package surface 11, a second package surface 12 opposing the first package surface 11, a plastic molding 13 providing the package housing and a semiconductor die 14. The first package surface 11 comprises a first surface 15 of the plastic molding 13 and a first metallic area 16 which is exposed from the plastic molding 13. A first product marking 17 is arranged on the first metallic area 16 and a second product marking 18 is arranged on the first surface 15 of the plastic molding 13.

As can be seen in the top view of FIG. 5B, the second product marking 18 is positioned adjacent to adjoining sides of the substantially rectangular first metallic area 17 and comprises a plurality of alphanumeric characters. The first product marking 17 is arranged in two rows on the first metallic area 16 and also comprises a plurality of alphanumeric characters and in some embodiments the same alphanumeric characters as the second product marking 18. In other embodiments, one or both of the product markings 17, 18 may have different forms, for example a two-dimensional matrix.

A heat sink may be mounted on the exposed upper surface 44 of the contact clip 28, for example, by solder, and cover the first product marking 17 formed in the upper surface 44. The product information is, however, still derivable from the second product marking 18 formed in the plastic molding 13.

The semiconductor package 100 comprises a lead frame 27 comprising a die pad 26 on which the semiconductor die 14 is mounted and a plurality of leads, in this embodiment three leads 22, 24, 25. One of the leads, for example, the central lead 22 of the three leads may be integral with the die pad 26. The two outer leads 24, 25 are arranged adjacent and spaced apart from the die pad 26.

In this embodiment, the semiconductor die 14 is illustrated as a transistor device which has a drain pad 33 on its lower surface 32 which is mounted on and electrically coupled to the die pad 26. The semiconductor die 14 includes a source pad 30 and gate pad 31 on its opposing upper surface 29. The source pad 30 is electrically connected to one of the leads 25 by a connector, such as the contact clip 28 which extends between the source pad 30 and the lead 25 and which has an upper surface which is exposed from the plastic molding compound 13 and forms the first metallic area 16. The lower surface 21 of the die pad 26 is completely covered by the plastic molding 13. The gate pad 31 is electrically connected to one of the leads 24 by a further connector such as a bond wire. One of the leads, for example the central lead 22 may be integral with the die pad 26 and form the drain lead of the package.

Other types of semiconductor packages which have topside cooling only, that is only one of the two opposing major surfaces of the semiconductor package includes an exposed metallic area, may also be provided with two product markings, one formed in the metallic area and one formed in the plastic molding. For example, a leadless package, such as an SO8 package or a leaded package, such as a TO 220 or TO 257 package may also be provided with two product markings according to one of the embodiments described herein.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
  a first package surface and a second package surface opposing the first surface;
  a plastic molding; and
  a semiconductor die,
  wherein the first package surface comprises a first surface of the plastic molding and a first metallic area exposed from the plastic molding,
  wherein the first metallic area comprises a first product marking comprising at least one alphanumeric character and the first surface of the plastic molding comprises a second product marking comprising at least one alphanumeric character, wherein the first product marking and the second product marking include the same alphanumeric character or characters which provide the same information about the product and alone each provide the information about the product.

2. The semiconductor package of claim 1, wherein the first product marking is formed by indentations and/or protrusions in a surface of the first metallic area, and wherein the second product marking is formed by indentations and/or protrusions in the first surface of the plastic molding.

3. The semiconductor package of claim 1, wherein the second product marking comprises a plurality of alphanumeric characters arranged in a vertical row, and wherein the first product marking comprises a plurality of alphanumeric characters.

4. The semiconductor device of claim 1, wherein the alphanumeric characters have a height that is greater than a width.

5. The semiconductor device of claim 1, wherein the second package surface comprises a second surface of the plastic molding and a second metallic area exposed from plastic molding.

6. The semiconductor device of claim 5, wherein the first package surface is a top surface of semiconductor package and the second package surface is a bottom surface of the semiconductor package, and wherein the second package surface further comprises at least one contact area that is exposed from the plastic molding and electrically connected to the semiconductor die.

7. The semiconductor package of claim 6, wherein the first metallic area is provided by a contact clip mounted on the semiconductor die and the second metallic area is a die pad, and wherein the semiconductor die is mounted on the die pad.

8. The semiconductor package of claim 7, wherein the semiconductor die is a vertical transistor device with a source pad and a gate pad on a first die surface and a drain pad on a second die surface opposing the first die surface, and wherein the source pad is mounted on the die pad, the gate pad is mounted on a gate lead and the clip is mounted on and extends between the drain pad and a drain lead.

9. The semiconductor package of claim 7, wherein the semiconductor die is a vertical transistor device with a source pad and a gate pad on a first die surface and a drain pad on a second die surface opposing the first die surface, and wherein the drain pad is mounted on the die pad, the gate pad is electrically connected to a gate lead by a connector and the clip is mounted on and extends between the source pad and a source lead.

10. The semiconductor package of claim 1, further comprising a heat sink mounted on the first metallic area.

11. A method for marking a semiconductor package, the method comprising:

providing a semiconductor package comprising a first package surface and a second package surface opposing the first package surface, a plastic molding, and a semiconductor die, wherein the first package surface comprises a first surface of the plastic molding and a first metallic area exposed from the plastic molding;

forming a first product marking comprising at least one alphanumeric character in the first metallic area; and forming a second product marking comprising at least one alphanumeric character in the first surface of the plastic molding, wherein the first product marking and the second product marking include the same alphanumeric character or characters which provide the same information about the product and alone each provide the information about the product.

12. The method of claim 11, wherein the first and second product marking are formed using a laser marking process.

13. The method of claim 12, wherein the laser marking process comprises directing a laser beam over the surface of the first metallic area and the first surface of the plastic molding and forming indentations and/or protrusions that represent the at least one alphanumeric character.

14. The method of claim 13, wherein the laser beam comprises a green laser, a Nd:YAG laser, or an Infra Red laser.

15. The method of claim 12, wherein a power and/or a pulse length for the laser marking process are different for forming the first product marking and the second product marking.

16. The method of claim 11, further comprising:

exposing the first metallic area from the plastic molding by grinding an outer initial surface of the plastic molding that completely covers the first metallic area, thus removing portions of the plastic molding, reducing the thickness of the plastic molding, and exposing the first metallic area.

* * * * *